(12) United States Patent
Hayashi et al.

(10) Patent No.: US 9,313,466 B2
(45) Date of Patent: Apr. 12, 2016

(54) COLOR IMAGING ELEMENT

(71) Applicant: FUJIFILM Corporation, Tokyo (JP)

(72) Inventors: Kenkichi Hayashi, Saitama (JP); Seiji Tanaka, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/661,952

(22) Filed: Oct. 26, 2012

(65) Prior Publication Data

US 2013/0048833 A1    Feb. 28, 2013

Related U.S. Application Data

(63) Continuation of application No. PCT/JP2011/067421, filed on Jul. 29, 2011.

(30) Foreign Application Priority Data

Mar. 9, 2011    (JP) .................................. 2011-051999
Jul. 25, 2011    (JP) .................................. 2011-162416

(51) Int. Cl.
*H01L 27/146*    (2006.01)
*H04N 9/04*    (2006.01)

(52) U.S. Cl.
CPC .......... *H04N 9/045* (2013.01); *H01L 27/14621* (2013.01)

(58) Field of Classification Search
CPC ......... H04N 9/73; H04N 9/735; H04N 9/045; H01L 31/02162; H01L 27/146; H01L 27/14601; H01L 27/14621

USPC ............... 250/208.1, 226; 348/272, 273, 276, 348/277, 280, 281, 282, 283
See application file for complete search history.

(56) References Cited

U.S. PATENT DOCUMENTS

| | | | | |
|---|---|---|---|---|
| 4,213,145 A | * | 7/1980 | Nagumo | 348/238 |
| 4,710,804 A | * | 12/1987 | Ide | 348/280 |
| 5,604,530 A | | 2/1997 | Saito et al. | |
| 5,847,758 A | * | 12/1998 | Iizuka | 348/317 |
| 6,343,146 B1 | | 1/2002 | Tsuruoka et al. | |
| 6,678,000 B1 | | 1/2004 | Sakata | |
| 6,995,796 B2 | | 2/2006 | Taubman | |

(Continued)

FOREIGN PATENT DOCUMENTS

| EP | 1 357 760 A1 | 10/2003 |
|---|---|---|
| EP | 1793620 A1 | 6/2007 |

(Continued)

OTHER PUBLICATIONS

ISR & Written Opinion in PCT/JP2012/080898 (English translation is attached).

(Continued)

*Primary Examiner* — John Lee
(74) *Attorney, Agent, or Firm* — Birch, Stewart, Kolasch & Birch, LLP

(57) ABSTRACT

A single-plate color imaging element including color filters in a predetermined color filter array arranged on a plurality of pixels formed by photoelectric conversion elements arranged in horizontal and vertical directions, wherein in the color filter array, the first filters are vertically and horizontally arranged across a filter at a center of a 3×3 pixel group, and the 3×3 pixel group is repeatedly arranged in the horizontal and vertical directions.

8 Claims, 10 Drawing Sheets

(56) References Cited

U.S. PATENT DOCUMENTS

| | | | |
|---|---|---|---|
| 7,027,091 | B1 | 4/2006 | Reyneri et al. |
| 7,146,042 | B2 | 12/2006 | Chen |
| 7,508,431 | B2* | 3/2009 | Sato et al. ............ 348/294 |
| 7,746,397 | B2* | 6/2010 | Nam .................... 348/280 |
| 7,755,682 | B2 | 7/2010 | Lin |
| 8,164,042 | B2* | 4/2012 | Tseng et al. ............ 250/226 |
| 8,203,633 | B2* | 6/2012 | Adams et al. ............ 348/277 |
| 8,456,553 | B2* | 6/2013 | Hayashi et al. ............ 348/273 |
| 8,466,993 | B2* | 6/2013 | Arai .................... 348/280 |
| 8,497,925 | B2* | 7/2013 | Ogasahara ............ 348/271 |
| 8,531,563 | B2* | 9/2013 | Tanaka ................ 348/273 |
| 2002/0054208 | A1 | 5/2002 | Goldstein et al. |
| 2002/0149686 | A1 | 10/2002 | Taubman |
| 2003/0133028 | A1 | 7/2003 | Morinaka et al. |
| 2003/0214594 | A1* | 11/2003 | Bezryadin ............ 348/280 |
| 2004/0109068 | A1 | 6/2004 | Mitsunaga et al. |
| 2004/0169747 | A1 | 9/2004 | Ono et al. |
| 2005/0280727 | A1* | 12/2005 | Sato et al. ............ 348/294 |
| 2006/0087567 | A1 | 4/2006 | Guarnera et al. |
| 2006/0114526 | A1 | 6/2006 | Hasegawa |
| 2006/0139468 | A1 | 6/2006 | Wada |
| 2006/0203113 | A1 | 9/2006 | Wada et al. |
| 2007/0013786 | A1 | 1/2007 | Chiba et al. |
| 2007/0153104 | A1 | 7/2007 | Ellis-Monaghan et al. |
| 2008/0151083 | A1 | 6/2008 | Hains et al. |
| 2008/0247671 | A1 | 10/2008 | Yasuma et al. |
| 2009/0066821 | A1 | 3/2009 | Achong et al. |
| 2009/0147109 | A1* | 6/2009 | Muresan ................ 348/253 |
| 2009/0189232 | A1* | 7/2009 | Silverstein et al. ............ 257/432 |
| 2009/0303359 | A1* | 12/2009 | Otsuka et al. ............ 348/280 |
| 2010/0265352 | A1 | 10/2010 | Nashizawa |
| 2010/0302423 | A1 | 12/2010 | Adams, Jr. et al. |
| 2011/0019041 | A1 | 1/2011 | Ishiwata et al. |
| 2011/0069189 | A1 | 3/2011 | Venkataraman et al. |
| 2011/0199520 | A1* | 8/2011 | Katou .................... 348/280 |
| 2011/0228114 | A1* | 9/2011 | Tominaga ............ 348/208.6 |
| 2011/0234842 | A1 | 9/2011 | Ishiga |
| 2012/0025060 | A1* | 2/2012 | Iwata .................... 250/208.1 |
| 2012/0092535 | A1* | 4/2012 | Masuno et al. ............ 348/278 |
| 2012/0293694 | A1* | 11/2012 | Hayashi et al. ............ 348/280 |
| 2012/0293695 | A1* | 11/2012 | Tanaka .................... 348/280 |
| 2012/0293696 | A1 | 11/2012 | Tanaka |
| 2012/0300104 | A1* | 11/2012 | Onuki et al. ............ 348/302 |
| 2012/0327277 | A1* | 12/2012 | Myhrvold ............ 348/279 |
| 2013/0048833 | A1* | 2/2013 | Hayashi et al. ............ 250/208.1 |
| 2013/0240715 | A1* | 9/2013 | Hayashi et al. ............ 250/208.1 |

FOREIGN PATENT DOCUMENTS

| | | |
|---|---|---|
| JP | 2-210996 A | 8/1990 |
| JP | 8-23542 A | 1/1996 |
| JP | 8-23543 A | 1/1996 |
| JP | 10-243407 A | 9/1998 |
| JP | 11-18097 A | 1/1999 |
| JP | 11-285012 A | 10/1999 |
| JP | 2000-308080 A | 11/2000 |
| JP | 2000-316166 A | 11/2000 |
| JP | 2001-339735 A | 12/2001 |
| JP | 2004-221839 A | 8/2004 |
| JP | 2004-266369 A | 9/2004 |
| JP | 2005-136766 A | 5/2005 |
| JP | 2006-157600 A | 6/2006 |
| JP | 2006-186965 A | 7/2006 |
| JP | 2007-37104 A | 2/2007 |
| JP | 2007-184904 A | 7/2007 |
| JP | 2007-306490 A | 11/2007 |
| JP | 2008-236620 A | 10/2008 |
| JP | 2008-258931 A | 10/2008 |
| JP | 2010-512048 A | 4/2010 |
| JP | 2010-104019 A | 5/2010 |
| JP | 2010-153511 A | 7/2010 |
| JP | 2011-523538 A | 8/2011 |
| JP | 5054856 B1 | 8/2012 |
| JP | 5054858 B1 | 8/2012 |
| RU | 2 383 967 C2 | 10/2009 |
| WO | 02/056604 A1 | 7/2002 |
| WO | WO 2008/066698 A2 | 6/2008 |
| WO | WO 2009/151903 A2 | 12/2009 |

OTHER PUBLICATIONS

ISR & Written Opinion in PCT/JP2012/080899 (English translation is attached).
ISR & Written Opinion in PCT/JP2012/081644 (English translation is attached).
ISR & Written Opinion in PCT/JP2012/083583 (English translation is attached).
European Search Report dated Aug. 4, 2014.
European Search Report dated Jul. 30, 2014.
Adams, Jim et al., "Color Porcessing in Digital Cameras", IEEE, Los Alamitos, CA, US, Nov. 1998, vol. 18, No. 6, pp. 20-30, XP805931A.
Extended European Search Report for European Application No. 11859950.5, dated Oct. 28, 2014.
Hirakawa et al., "Spatio-Spectral Color Filter Array Design for Optimal Image Recovery", IEEE Transactions on Image Processing, IEEE, Oct. 2008, vol. 17, No. 10, pp. 1876-1890, XP11234206A.
Li, Yan et al., "Color Filter Arrays: A Design Methodology", University of London—Dept. of Computer Science, May 2008, vol. RR-08-03.
Parulski et al., "High-performance digital color video camera", J. Electronic Imaging, Jan. 1992, vol. 1, No. 1, pp. 35-45, XP323326A.
Russian Office Action for Russian Application No. 2013138394/07(058091), dated Oct. 15, 2014.
Decision on Grant issued Dec. 9, 2014 for corresponding Russian Patent Application No. 2013141183 with English translation.
US Office Action mailed May 21, 2015 issued in related Application No. 13/887,024. E.
Office Action dated Jun. 25, 2015 issued in related Japanese Application No. 2012-165732 with English translation.
Office Action dated Jun. 25, 2015 issued in related Japanese Application No. 2012-165734 with English translation.
Russian Decision on Grant for Russian Application No. 2013138724/07, dated Dec. 11, 2014, with an English translation.
European Official Communication issued on Jul. 10, 2015 in European Patent Application No. 11 859 950.5.
Japanese Office Action issued on Oct. 23, 2015 in Japanese Patent Application No. 2012-152815 with an English Translation.
Final Office Action dated Nov. 24, 2015 issued in co-pending U.S. Appl. No. 13/887,024.

* cited by examiner

VERTICAL DIRECTION

P

HORIZONTAL DIRECTION

A ARRAY    B ARRAY

COLOR IMAGING ELEMENT

This application is a continuation application and claims the priority benefit under 35 U.S.C. §120 of PCT Application No. PCT/JP2011/067421 filed on Jul. 29, 2011 which application designates the U.S., and also claims the priority benefit under 35 U.S.C. §119 of Japanese Patent Applications No. 2011-051999 filed on Mar. 9, 2011 and No. 2011-162416 filed on Jul. 25, 2011, which applications are all hereby incorporated in their entireties by reference.

TECHNICAL FIELD

The present invention relates to a color imaging element, and particularly, to a color imaging element that can suppress generation of color moire.

BACKGROUND ART

In a color imaging apparatus including a single-plate color imaging element, an output image from the color imaging element is a RAW image (mosaic image). Therefore, a multi-channel image is obtained by a process of interpolating a pixel of a missing color from a surrounding pixel (demosaicing processing). In this case, there is a problem in reproduction characteristics of a high-frequency image signal.

A primary-color Bayer array as a color array most widely used in the single-plate color imaging element includes green (G) pixels arranged in a check pattern and red (R) and blue (B) arranged line-sequentially. Therefore, there is a problem of low-frequency coloring (color moire) caused by folding of high frequency signals exceeding reproduction bands of the colors and caused by deviation of phases of the colors.

A black and white vertical-striped pattern (high frequency image) as shown in FIG. 14(A) enters an imaging element in a Bayer array shown in FIG. 14(B), and the pattern is sorted into Bayer color arrays to compare the colors. As shown in FIGS. 14(C) to 14(E), R forms a light and flat color image, B forms a dark and flat color image, and G forms a light and dark mosaic color image. Although there is no density difference (level difference) between RGB with respect to the original black and white image, the image is colored depending on the color array and the input frequency.

Similarly, a black and white oblique high frequency image as shown in FIG. 15(A) enters an imaging element in a Bayer array shown in FIG. 15(B), and the image is sorted into Bayer color arrays to compare the colors. As shown in FIGS. 15(C) to 15(E), R and B form light and flat color images, while G forms a dark and flat color image. Assuming that the value of black is 0 and the value of white is 255, the black and white oblique high frequency image turns green, because only G is 255. In this way, the oblique high frequency image cannot be correctly reproduced in the Bayer array.

In the color imaging apparatus using the single-plate color imaging element, an optical low-pass filter formed by an anisotropic substance such as crystal is generally arranged on the front side of the color imaging element to prevent optically reducing the high frequency wave. However, although the coloring caused by folding of the high frequency signal can be reduced in the method, there is a problem that the resolution is reduced accordingly.

To solve the problem, a color imaging element is proposed, wherein a color filter array of the color imaging element is a three-color random array satisfying array restrictions in which an arbitrary target pixel is adjacent to three colors including the color of the target pixel on four sides of the target pixel (PTL 1).

An image sensor of a color filter array is also proposed, wherein the image sensor includes a plurality of filters with different spectral sensitivity, and first and second filters among the plurality of filters are alternately arranged in a first predetermined period in one of the diagonal directions of a pixel grid of the image sensor and are alternately arranged in a second predetermined period in the other diagonal direction (PTL 2).

Meanwhile, PTL 3 describes a technique of using surrounding pixels of a target pixel of a mosaic image in a Bayer array to calculate correlations in horizontal, vertical, and oblique (NE, NW) directions (four directions), and weights are applied according to ratios of the calculated correlations to interpolate the pixels.

A color imaging element is also proposed, wherein R and B among the three primary colors of RGB are arranged every three pixels in horizontal and vertical directions, and G is arranged between R and B (PTL 4).

A color filter array of the color imaging element includes a basic array pattern corresponding to 4×4 pixels, and the basic array pattern is repeatedly arranged in the horizontal and vertical directions. The numbers of RGB pixels in the basic array pattern are two pixels, twelve pixels, and two pixels, respectively. Therefore, the ratio of the numbers of RGB pixels is 1:6:1, and significantly more G pixels than the R and B pixels are arranged.

CITATION LIST

Patent Literature

{PTL 1} Japanese Patent Application Laid-Open No. 2000-308080
{PTL 2} Japanese Patent Application Laid-Open No. 2005-136766
{PTL 3} Japanese Patent Application Laid-Open No. 2010-104019
{PTL 4} Japanese Patent Application Laid-Open No. 8-23543

SUMMARY OF INVENTION

Technical Problem

The three-color random array described in PTL 1 is effective for low-frequency color moire, but is not effective for a false color of a high frequency section.

In the color filter array of the image sensor described in PTL 2, the R, G, and B filters are periodically arranged in the lines in the horizontal and vertical directions of the color filter array. In demosaicing processing of a mosaic image output from the image sensor including the color filter array in the invention described in PTL 2, a local area in a predetermined image size is extracted around the target pixel, statistics related to a color distribution shape of the color of the target pixel in the local area and a color distribution shape of another color to be estimated are calculated, and the color distribution shapes are linearly regressed based on the intensity of the colors at the target pixel position and based on the statistics of the color distribution shapes to thereby calculate an estimation value of the another color at the target pixel position. The calculation of the statistics (covariance values) related to the color distribution shapes and the regression calculation process are necessary in the invention described in PTL 2, and there is a problem that the image processing is complicated.

Meanwhile, the pixel interpolation method described in PTL 3 is applied to a mosaic image in a Bayer array. However, G pixels are not consecutive in the horizontal and vertical directions in the Bayer array, and the correlations in the horizontal and vertical directions cannot be calculated at minimum pixel intervals. For example, the correlations are falsely determined when a vertical-striped or horizontal-striped high frequency wave of one pixel period is input, and there is a problem that the pixels cannot be accurately interpolated.

In the color imaging element described in PTL 3, the proportion of the number of G pixels is higher that the proportions of the numbers of R and B pixels, and there are sections where two or more G pixels continue in the horizontal, vertical, and oblique directions. A direction with a small change in luminance (direction with high correlation) can be determined, and the resolution can be increased. However, there are lines with only G pixels in the horizontal or vertical direction, and the color imaging element is not effective for a false color of a high frequency section in the horizontal or vertical direction.

The present invention has been made in view of the circumstances, and an object of the present invention is to provide a color imaging element that can suppress generation of a false color of a high frequency section by simple image processing.

Solution to Problem

To attain the object, an invention according to an aspect of the present invention provides a single-plate color imaging element including color filters in a predetermined color filter array arranged on a plurality of pixels formed by photoelectric conversion elements arranged in horizontal and vertical directions, wherein the color filter array includes a predetermined basic array pattern including first filters corresponding to a first color that most contributes to obtaining luminance signals and second filters corresponding to two or more second colors other than the first color, the basic array pattern repeatedly arranged in the horizontal and vertical directions, one or more first filters and one or more second filters are arranged in each line in the horizontal and vertical directions of the color filter array in the basic array pattern, and the first filters are arranged to further include sections where two or more first filters are adjacent to each other in horizontal, vertical, and oblique (NE, NW) directions in the basic array pattern.

According to the color imaging element of an aspect of the present invention, the first filters corresponding to the first color that most contributes to obtaining the luminance signals are arranged to include sections where two or more first filters are adjacent to each other in the horizontal, vertical, and oblique (NE, NW) directions in the basic array pattern. Therefore, which one of the four directions is the correlation direction of luminance can be determined at minimum pixel intervals based on the pixel values of the pixels of the first color adjacent to each other in each direction. As a result, in the calculation of the pixel values of other colors at the pixel positions of the target pixels of the demosaicing processing extracted from the mosaic image output from the color imaging element, the pixel values of the pixels of the other colors in the correlation direction can be used according to the correlation direction of luminance determined based on the pixel values at the minimum pixel intervals. In this way, the pixel values of the pixels of the other colors can be accurately estimated, and the generation of the false color at the high frequency section can be suppressed. The method described in PTL 3 or various other methods can be applied for the processing method of estimating the pixel values of the other colors based on the determination result of the correlation direction.

The one or more first filters and the one or more second filters are arranged in each line in the horizontal and vertical directions of the basic array pattern. Therefore, the generation of the color moire (false color) can be suppressed, and the resolution can be increased. In the color filter array, the predetermined basic array pattern is repeated in the horizontal and vertical directions. Therefore, demosaicing (interpolation) processing in a later stage can be executed according to the repeated pattern.

Preferably, in the color imaging element according to another aspect of the present invention, the color filter array includes two or more first filters consecutively arranged in the horizontal and vertical directions across a filter of one of the colors of the second filters. Which one of the four directions is the correlation direction of luminance can be determined at minimum pixel intervals based on the pixel values of the pixels corresponding to the two or more consecutive first filters.

In the color imaging element according to another aspect of the present invention, the color filter array includes a square array corresponding to 2×2 pixels formed by the first filters. Which one of the four directions is the correlation direction of luminance can be determined at minimum pixel intervals based on the pixel values between four pixels of the square array corresponding to 2×2 pixels.

Preferably, in the color imaging element according to another aspect of the present invention, the color filter array in the predetermined basic array pattern is point symmetric with respect to a center of the basic array pattern. As a result, the circuit size of the processing circuit in a later stage can be reduced.

Preferably, in the color imaging element according to another aspect of the present invention, the predetermined basic array pattern is a square array pattern corresponding to N×N (N: integer 4 or more and 8 or less) pixels. When N is smaller than 4, the conditions of the color filter array according to the present invention are not satisfied. When N is greater than 8, signal processing such as demosaicing becomes complicated, while particular advantageous effects cannot be attained by increasing the size of the basic array pattern.

Preferably, in the color imaging element according to another aspect of the present invention, the predetermined basic array pattern is a square array pattern corresponding to 6×6 pixels.

As described, it is preferable that the predetermined basic array pattern is a square array pattern corresponding to N×N pixels and that N is an integer 4 or more and 8 or less. For N, an even number is more advantageous in the demosaicing processing than an odd number. When N is 4, the basic array pattern does not include a section where the first filters continue for two or more pixels in each line in the horizontal, vertical, and oblique (NE, NW) directions, which is disadvantageous in the determination of the direction with a small change in luminance. When N is 8, the signal processing is more cumbersome compared to when N is 6. Therefore, it is most preferable that N is 6 in the basic array pattern, i.e. the square array pattern corresponding to 6×6 pixels.

Preferably, in the color filter array of the color imaging element according to another aspect of the present invention, the first filters are vertically and horizontally arranged across a filter at a center of a 3×3 pixel group, and the 3×3 pixel group is repeatedly arranged in the horizontal and vertical directions. The first filters are vertically and horizontally arranged across the filter at the center of the 3×3 pixel group. Therefore, if the 3×3 pixel group is repeatedly arranged in the horizontal and vertical directions, the first filters are adjacent to each other (in two pixels) in the horizontal and vertical directions across the filter at the center of the 3×3 pixel group in the color filter array. The pixel values of the pixels (eight pixels in total) corresponding to the first filters can be used to determine the correlation direction of the four directions.

Preferably, in the color filter array of the color imaging element according to another aspect of the present invention, the first filters are arranged at a center and four corners of a 3×3 pixel group, and the 3×3 pixel group is repeatedly arranged in the horizontal and vertical directions. The first filters are arranged at four corners of the 3×3 pixel group. Therefore, if the 3×3 pixel group is repeatedly arranged in the horizontal and vertical directions, the color filter array includes square arrays corresponding to 2×2 pixels including the first filters. The pixel values of the 2×2 pixels can be used to determine the direction with high correlation among the horizontal, vertical, and oblique (NE, NW) directions.

In the color imaging element according to another aspect of the present invention, the first color is green (G), and the second colors are red (R) and blue (B).

In the color imaging element according to another aspect of the present invention, the color filters include R filters, G filters, and B filters corresponding to red (R), green (G), and blue (B) colors, and the color filter array includes: a first array corresponding to 3×3 pixels, the first array including an R filter arranged at a center, B filters arranged at four corners, and G filters vertically and horizontally arranged across the R filter at the center; and a second array corresponding to 3×3 pixels, the second array including a B filter arranged at a center, R filters arranged at four corners, and G filters vertically and horizontally arranged across the B filter at the center, wherein the first and second arrays are alternately arranged in the horizontal and vertical directions.

According to the color filter array with the configuration, when 5×5 pixels (local area of mosaic image) are extracted around the first or second array, there are G pixels adjacent to each other in the horizontal and vertical directions across the pixel (R pixel or B pixel) at the center of the 5×5 pixels. The pixel values of the G pixels (eight pixels in total) can be used to determine the correlation direction of the four directions.

In the color imaging element according to another aspect of the present invention, the color filters include R filters, G filters, and B filters corresponding to red (R), green (G), and blue (B) colors, and the filter array includes: a first array corresponding to 3×3 pixels, the first array including G filters arranged at a center and four corners, B filters vertically arranged across the G filter at the center, and R filters horizontally arranged across the G filter at the center; and a second array corresponding to 3×3 pixels, the second array including G filters arranged at a center and four corners, R filters vertically arranged across the G filter at the center, and B filters horizontally arranged across the G filter at the center, wherein the first and second arrays are alternately arranged in the horizontal and vertical directions.

According to the color filter array with the configuration, there are G pixels of 2×2 pixels at four corners of 5×5 pixels when the 5×5 pixels (local area of mosaic image) are extracted around the first or second array. The pixel values of the G pixels of the 2×2 pixels can be used to determine the correlation direction of four directions.

Advantageous Effects of Invention

According to the present invention, included is a predetermined basic array pattern including first filters corresponding to a first color that most contributes to obtaining luminance signals and second filters corresponding to two or more second colors other than the first color. The basic array pattern is repeatedly arranged in horizontal and vertical directions to form a color filter array, and the first filters are arranged to include sections where two or more first filters are adjacent to each other in horizontal, vertical, and oblique (NE, NW) directions in the basic array pattern. Therefore, which one of the four directions is the correlation direction of luminance can be determined at minimum pixel intervals based on the pixel values of the pixels of the first color adjacent to each other in each direction. The one or more first filters and the one or more second filters are arranged in each line in the horizontal and vertical directions in the basic array pattern. Therefore, the generation of the color moire (false color) can be suppressed, and the resolution can be increased. In the color filter array, the predetermined basic array pattern is repeated in the horizontal and vertical directions. Therefore, demosaicing (interpolation) processing in a later stage can be executed according to the repeated pattern.

BRIEF DESCRIPTION OF DRAWINGS

FIG. 10 is a diagram showing a third embodiment of the single-plate color imaging element according to the present invention.

FIG. 11 is a diagram showing a fourth embodiment of the single-plate color imaging element according to the present invention.

FIG. 12 is a diagram showing a fifth embodiment of the single-plate color imaging element according to the present invention.

FIG. 13 is a diagram showing a sixth embodiment of the single-plate color imaging element according to the present invention.

DESCRIPTION OF EMBODIMENTS

Hereinafter, preferred embodiments of a color imaging element according to the present invention will be described in detail with reference to the attached drawings.

{First Embodiment of Color Imaging Element}

Figure 1:
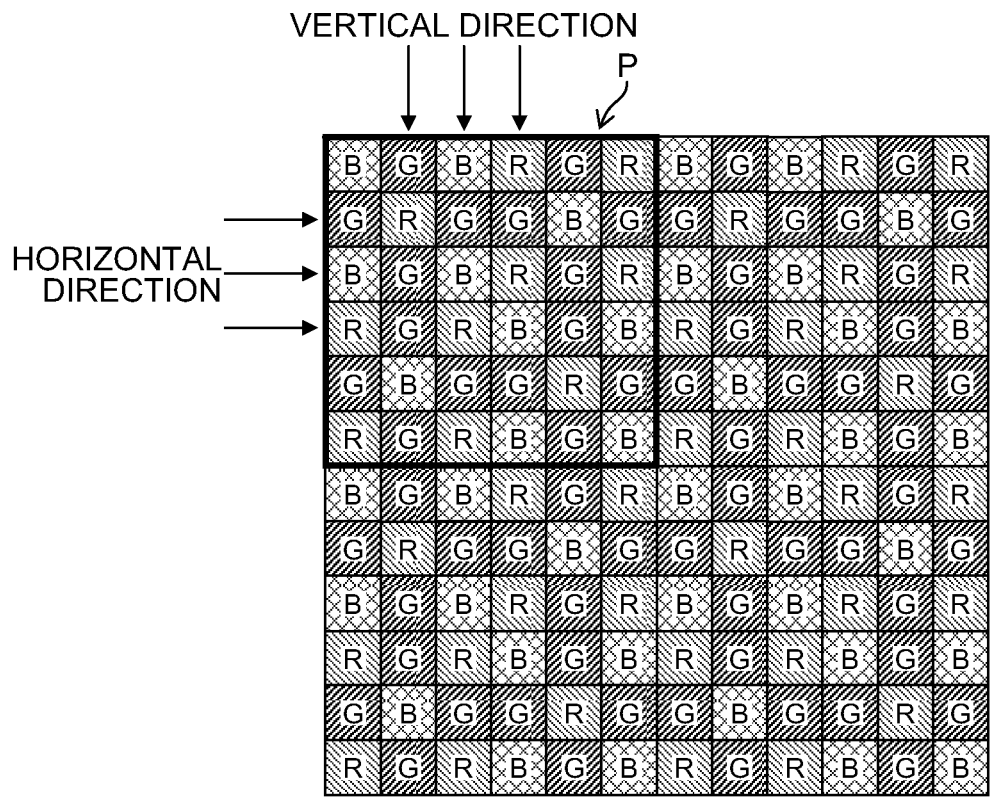
FIG. 1 is a diagram showing a first embodiment of a single-plate color imaging element according to the present invention.

FIG. 1 is a diagram showing a first embodiment of a single-plate color imaging element according to the present invention. FIG. 1 particularly shows a color filter array of color filters arranged on the color imaging element.

The color imaging element includes: a plurality of pixels (not shown) formed by photoelectric conversion elements arranged in horizontal and vertical directions (two-dimensional array); and color filters in a color filter array shown in FIG. 1 arranged on light receiving surfaces of the pixels. One of the color filters of three primary colors of red (R), green (G), and blue (B) is arranged on each pixel.

The color imaging element is not limited to a CCD (Charge Coupled Device) color imaging element and may be another type of imaging element such as a CMOS (Complementary Metal Oxide Semiconductor) imaging element.

<Features of Color Filter Array>

The color filter array of the color imaging element of the first embodiment has the following features (1), (2), (3), and (4).

{Feature (1)}

The color filter array shown in FIG. 1 includes a basic array pattern P (pattern indicated by a thick frame) formed by a square array pattern corresponding to 6×6 pixels, and the basic array pattern P is repeatedly arranged in the horizontal and vertical directions. Therefore, the color filter array includes filters of each of R, G, and B colors (R filters, G filters, and B filters) arranged in a predetermined cycle.

In this way, the R filters, the G filters, and the B filters are arranged in a predetermined cycle. Therefore, demosaicing (interpolation) processing and the like of R, G, and B signals read out from the color imaging element can be processed according to the repeated pattern.

When a thinning-out process is executed based on the basic array pattern P to reduce the image, the color filter array of the reduced image after the thinning-out process can be the same as the color filter array before the thinning-out process. Therefore, a common processing circuit can be used.

{Feature (2)}

The basic array pattern P that forms the color filter array shown in FIG. 1 includes one or more G filters corresponding to a color that most contributes to obtaining luminance signals (color of G in the embodiment) and one or more R and B filters corresponding to colors other than the color of G (R and B in the embodiment) arranged in each line in the horizontal and vertical directions of the basic array pattern.

The R, G, and B filters are arranged in each line in the horizontal and vertical directions of the basic array pattern P. Therefore, the generation of color moire (false color) can be suppressed. As a result, it is possible not to arrange an optical low-pass filter for controlling the generation of the false color on an optical path from a plane of incident to an imaging plane of the optical system. Even if the optical low-pass filter is applied, a filter with less effect of cutting high frequency components for preventing the generation of the false color can be applied, and a loss of resolution can be prevented.

{Feature (3)}

The G filters corresponding to the luminance pixels are arranged to include sections where two or more G filters are adjacent to each other in the horizontal, vertical, and oblique (NE, NW) directions of the color filter array P.

Figure 2:
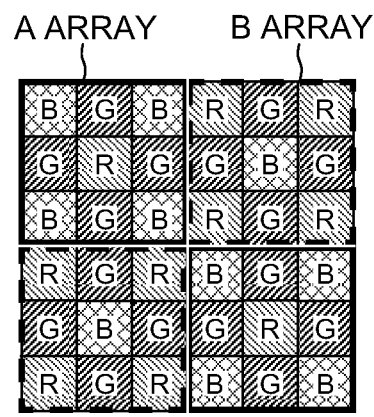
FIG. 2 is a diagram showing a basic array pattern included in a color filter array of the color imaging element according to the first embodiment.

FIG. 2 shows a state in which the basic array pattern P shown in FIG. 1 is divided into four sets of 3×3 pixels.

As shown in FIG. 2, the basic array pattern P can be perceived as a pattern including A arrays of 3×3 pixels surrounded by a frame of solid lines and B arrays of 3×3 pixels surrounded by a frame of broken lines alternately arranged in the horizontal and vertical directions.

The A array includes an R filter arranged at the center, B filters arranged at four corners, and G filters vertically and horizontally arranged across the R filter at the center. Meanwhile, the B array includes a B filter arranged at the center, R filters arranged at four corners, and G filters vertically and horizontally arranged across the B filter at the center. Although the positional relationship between the R and B filters is opposite in the A and B arrays, the rest of the arrangement is the same.

Figure 3A:
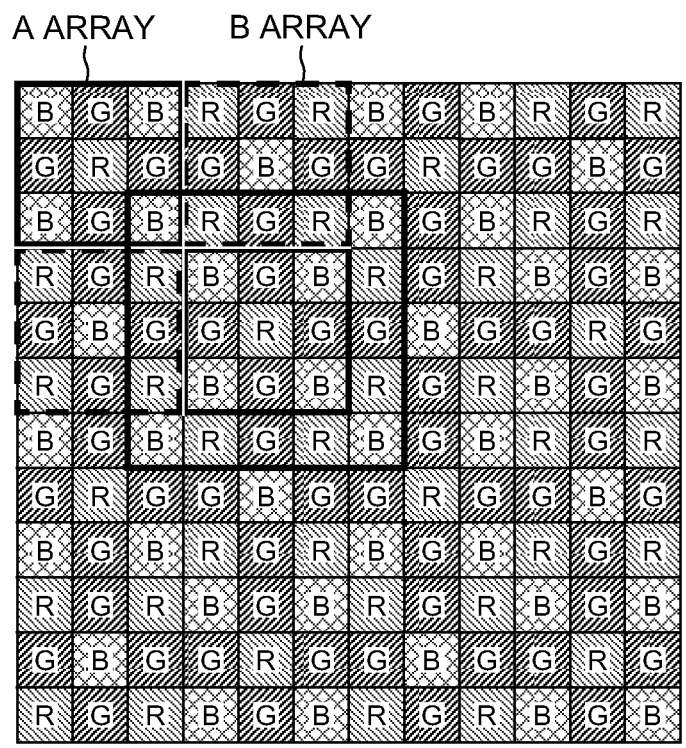
FIG. 3A is a diagram showing a color filter array in which the basic array pattern of 6×6 pixels included in the color filter array of the color imaging element of the first embodiment are divided into A arrays and B arrays of 3×3 pixels, and the A arrays and the B arrays are repeatedly arranged in horizontal and vertical directions.

As shown in FIG. 3A, the color filter array of the color imaging element of the first embodiment can be perceived as an array including the A and B arrays alternately arranged in the horizontal and vertical directions.

Figure 3B:
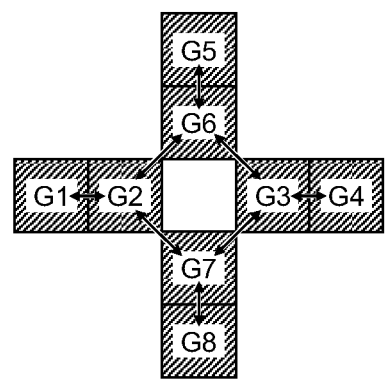
FIG. 3B is a diagram showing a characteristic arrangement of G pixels in the color filter array shown in FIG. 3A.

The G filters as luminance pixels are vertically and horizontally arranged across the filter at the center in 3×3 pixels of the A or B array, and the 3×3 pixels are alternately arranged in the horizontal and vertical directions. Sections where two or more G filters are adjacent to each other in the horizontal, vertical, and oblique (NE, NW) directions are formed, and the G filters are arranged in a cross shape as shown in FIG. 3B. The arrays satisfy the features (1) and (3), and the feature (2) is satisfied for the G filters.

As shown in FIG. 3A, if a local area of 5×5 pixels (area indicated by a thick frame) is extracted around the A array from the mosaic image output from the color imaging element of the first embodiment, eight G pixels in the local area are arranged in a cross shape as shown in FIG. 3B. The G pixels from left to right are defined as G1, G2, G3, and G4, and the G pixels from top to bottom are defined as G5, G6, G7, and G8. The pixels G1 and G2 as well as the pixels G2 and G3 are adjacent to each other in the horizontal direction. The pixels G5 and G6 as well as the pixels G7 and G8 are adjacent to each other in the vertical direction. The pixels G6 and G3 as well as the pixels G2 and G7 are adjacent to each other in the upper left oblique direction. The pixels G6 and G2 as well as the pixels G3 and G7 are adjacent to each other in the upper right oblique direction.

Therefore, calculation of difference absolute values of the pixel values of the adjacent pixels can determine, at a minimum pixel interval, a direction with the minimum change in the luminance (correlation direction with high correlation) among the horizontal, vertical, and oblique (NE, NW) directions.

More specifically, the sum of the difference absolute values in the horizontal direction is |G1−G2|+|G3−G4|. The sum of the difference absolute values in the horizontal direction is |G5−G6|+|G7−G8|. The sum of the difference absolute values in the upper right oblique direction is |G6−G2|+|G3−G7|. The sum of the difference absolute values in the upper left oblique direction is |G6−G3|+|G2−G7|.

It can be determined that there is a correlation (correlation direction) in the direction with the minimum difference absolute value among the four correlation absolute values. The determined correlation direction can be used in demosaicing (interpolation) processing and the like.

In the embodiment, although the direction with the minimum change in the luminance (correlation direction with high correlation) is determined based on the difference values of the pixel values of the adjacent G pixels, the arrangement is not limited to this. The direction with the minimum change in the luminance may be determined based on ratios of the pixel values of the adjacent G pixels. When the change in the luminance is determined based on the ratios of the pixel values of the adjacent G pixels, the direction with the ratio of about 1 is a direction with a small change in the luminance.

<Interpolation Method Using Correlation Direction>

An interpolation method using the correlation direction determined as described above will be described.

Figure 4:
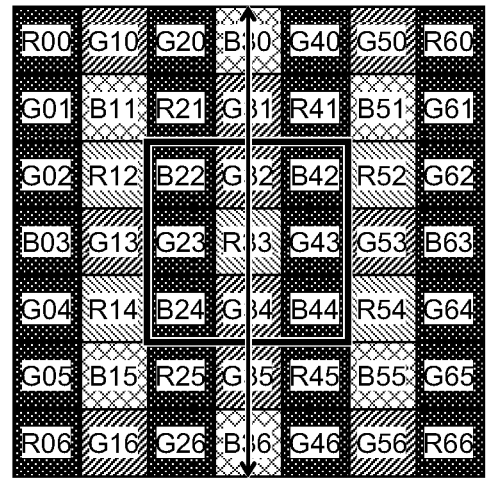
FIG. 4 is a diagram used to describe a pixel interpolation method in demosaicing processing when it is determined that a correlation direction is in a vertical direction.

As shown in FIG. 4, if it is determined that the correlation direction is in the vertical direction, the pixel values of neighborhood pixels of the same color in the correlation direction are used to interpolate and calculate the pixel values of other colors at the pixel positions of 3×3 pixels (A array) in the thick frame shown in FIG. 4.

To interpolate the pixel values of G, the pixel value of G23 is used for pixel values G22' and G24' of G at the pixel positions of B22 and B24, and the pixel value of G43 is used for pixel values G42' and G44' of G at the pixel positions of B42 and B44. Meanwhile, an average value of the pixel values of G32 and G34 is used for a pixel value G33' of G at the pixel position of R33.

To interpolate the pixel values of R and B, the pixel value of R21 is used for a pixel value R22' of R at the pixel position of B22. An average value of the pixel values of R21 and R25 and an average value of the pixel values of B22 and B24 are used for the pixel values R23' and B23' of R and B at the pixel position of G23, respectively. The pixel values of R21 and R25 are used for pixel values R22' and R24' of R at the pixel positions of B22 and B24, respectively.

Pixel values of R33 and B30 are used for pixel values R32' and B32' of R and B at the pixel position of G32, respectively. An average value of the pixel values of B30 and B36 is used for a pixel value B33' of B at the pixel position of R33. Pixel values of R33 and B36 are used for pixel values R34' and B34' of R and B at the pixel positions of G34, respectively.

The pixel value of R41 is used for a pixel value R42' of R at the pixel position of B42. An average value of the pixel values of R41 and R45 and an average value of the pixel values of B42 and B44 are used for pixel values R43' and B43' of R and B at the pixel position of G43, respectively. The pixel value of R45 is used for a pixel value R44' of R at the pixel position of B44.

In the B array, R and B are switched to execute a similar process to interpolate the pixel values of RGB.

The process is repeated for every 3×3 pixels to interpolate the pixel values of RGB.

Figure 5:
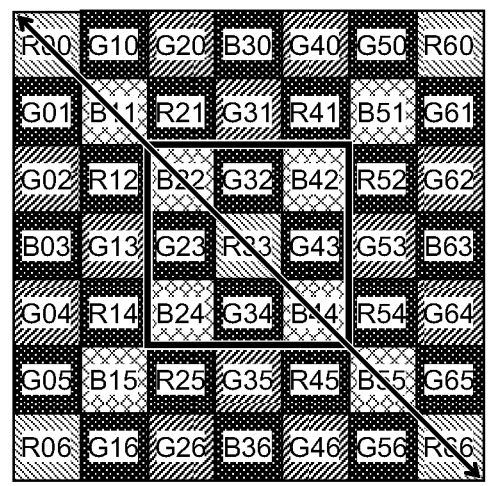
FIG. 5 is a diagrams used to describe a pixel interpolation method in demosaicing processing when it is determined that the correlation direction is in an upper left direction.

Meanwhile, as shown in FIG. 5, if it is determined that there is the correlation direction in the upper left oblique direction, and there are neighborhood pixels of the colors to be interpolated in the correlation direction, the pixel values of the pixels are used to interpolate and calculate the pixel values of other colors at the pixel positions of the 3×3 pixels (A array) in the thick frame shown in FIG. 5. If there are no pixels of the colors to be interpolated in the correlation direction, a relationship between differences or ratios (color differences or color ratios) of the pixel values of RGB of neighborhood interpolated pixels is used for the interpolation.

The pixels including pixels of the colors to be interpolated in the interpolation direction are interpolated first. In FIG. 5, the pixel value of R23 is used for the pixel value R22' of R at the pixel position of B22. The pixel value of R21 is used for the pixel value R32' of R at the pixel position of G32. An average value of the pixel values of G31 and G53 is used for the pixel value G42' of G at the pixel position of B42. Subsequently, the pixel values of the pixels of the colors to be interpolated in the correlation direction are similarly used for R23', B33', R43', G24', R34', and R44'.

A processing method of the interpolation of the pixels without the pixels of the colors to be interpolated in the correlation direction will be described.

To interpolate and calculate the pixel value G22' of G at the pixel position of B22 of FIG. 5, the color differences between G13 and an interpolated pixel value B13' and between G31 and an interpolated pixel value B31' are used for the interpolation. Specifically, the value is calculated based on the computation of the following formula.

$$G22'=B22+(G13+G31)/2-(B13'+B31')/2 \quad \{\text{Expression 1}\}$$

Similarly, the interpolation method of the pixel value B32' of B at the pixel position of G32 and the pixel value R42' of R at the pixel position of B42 is as in the following formulas.

$$B32'=G32+B31'-G31$$

$$R42'=B42+R33-B33' \quad \{\text{Expression 2}\}$$

Similar processing is executed to interpolate B32', B33', B43', R24', B34', and G44'.

The process is repeated for every 3×3 pixels to interpolate the pixel values of RGB.

Even if it is determined that the correlation direction is in the horizontal direction or that the correlation direction is in the upper right oblique direction due to the symmetry of the color filter of RGB in the A and B arrays, the pixel values of RGB can be similarly interpolated and calculated as in the case in which it is determined that the correlation direction is in the vertical direction or the upper left oblique direction.

Although the color differences are used for the interpolation in Expressions 1 and 2, the color ratios may be used for the interpolation.

{Feature (4)}

The basic array pattern P that forms the color filter array shown in FIG. 1 is point symmetric with respect to the center of the basic array pattern P.

As shown in FIG. 2, the A and B arrays in the basic array pattern are point symmetric with respect to the R filter or the G filter at the center, respectively, and the A and B arrays are also vertically and horizontally symmetric (line symmetric).

The symmetry can reduce or simplify the circuit size of a processing circuit of a later stage.

{Feature (5)}

In the basic array pattern of the color filter array shown in FIG. 1, the numbers of pixels of the R pixels, the G pixels, and the B pixels corresponding to the R, G, and B filters in the basic array pattern are ten pixels, sixteen pixels, and ten pixels, respectively. Therefore, the ratio of the numbers of pixels of the RGB pixels is 5:8:5, and the proportion of the number of G pixels that most contribute to obtaining the luminance signals is greater than the proportions of the numbers of R or B pixels of other colors.

The proportion of the number of G pixels and the proportions of the numbers of R or B pixels are different, and particularly, the proportion of the number of G pixels that most contribute to obtaining the luminance signals is greater than the proportions of the numbers of R or B pixels. Therefore, aliasing in the demosaicing processing can be suppressed, and high frequency reproducibility can be improved.

Although there are a plurality of basic array patterns that can form the color filter array shown in FIG. 1 by repeatedly arranging the basic array pattern in the horizontal and vertical directions, in the first embodiment, the basic array pattern P in which the basic array pattern is point symmetric is called a basic array pattern for convenience.

Although there are also a plurality of basic array patterns for each of the color filter arrays in the other embodiments described below, the representative one will be called a basic array pattern of the color filter array.

{Second Embodiment of Color Imaging Element}

Figure 6:
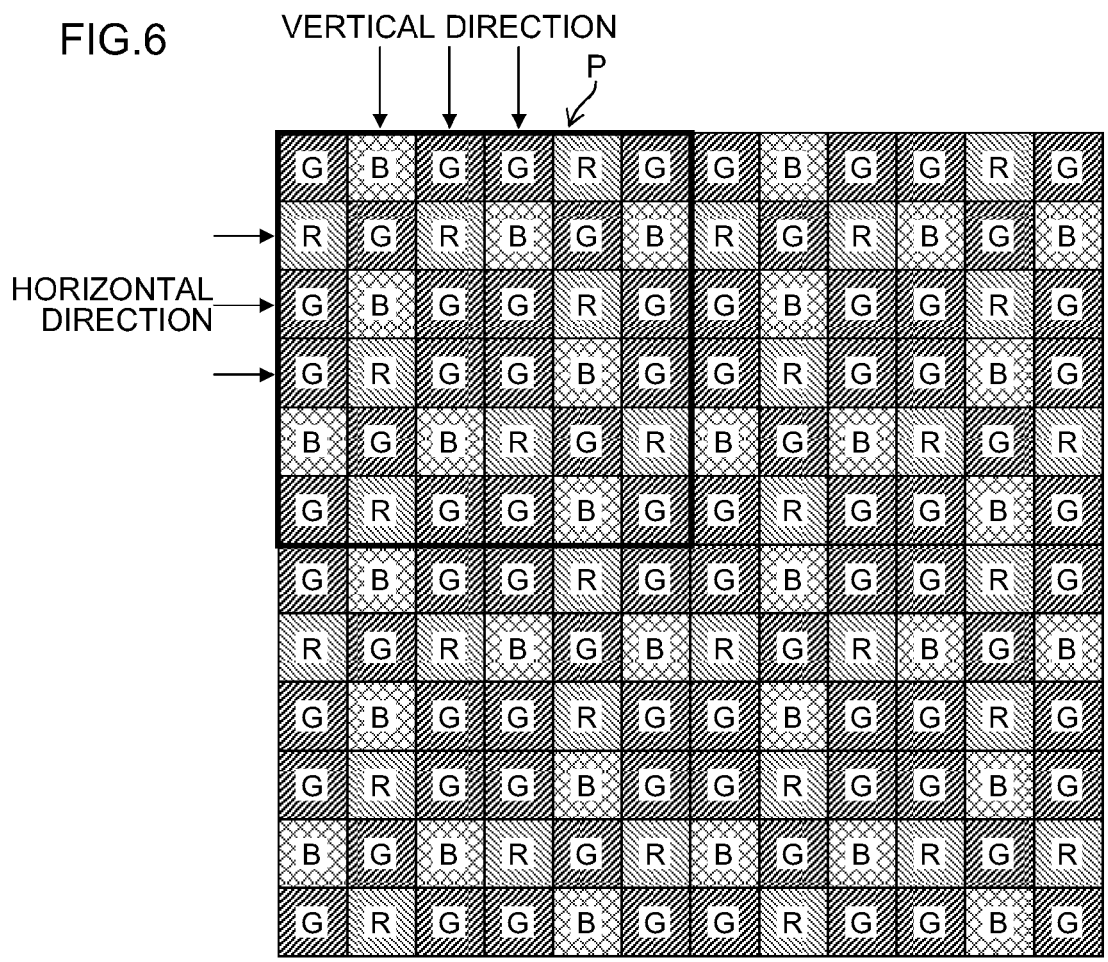
FIG. 6 is a diagram showing a second embodiment of the single-plate color imaging element according to the present invention.

FIG. 6 is a diagram showing a second embodiment of the single-plate color imaging element according to the present invention. FIG. 6 particularly shows a color filter array of color filters arranged on the color imaging element.

The color filter array of the color imaging element of the second embodiment includes a basic array pattern P (pattern shown by a thick frame) formed by a square array pattern corresponding to 6×6 pixels, and the basic array pattern P is repeatedly arranged in the horizontal and vertical directions. Therefore, the color filter array includes filters of each of R, G, and B colors (R filters, G filters, and B filters) arranged in a predetermined cycle.

As in the first embodiment, the basic array pattern P forming the color filter array includes one or more filters of all R, G, and B colors in each line in the horizontal and vertical directions of the basic array pattern.

The G filters corresponding to the luminance pixels are arranged to include sections where two or more G filters are adjacent to each other in the horizontal, vertical, and oblique (NE, NW) directions of the color filter array P.

Figure 7:
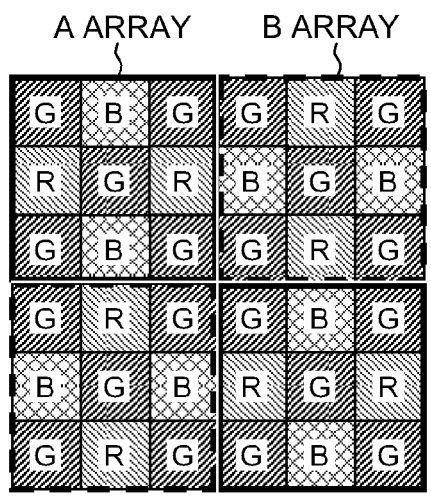
FIG. 7 is a diagram showing a basic array pattern included in a color filter array of the color imaging element of the second embodiment.

FIG. 7 shows a state in which the basic array pattern P shown in FIG. 6 is divided into four sets of 3×3 pixels.

As shown in FIG. 7, the basic array pattern P can be perceived as a pattern including A arrays of 3×3 pixels surrounded by a frame of solid lines and B arrays of 3×3 pixels surrounded by a frame of broken lines alternately arranged in the horizontal and vertical directions.

Each of the A and B arrays includes G filters as luminance pixels arranged at four corners and the center, and the G filters are arranged on both diagonals. In the A array, the R filters are arranged in the horizontal direction, and the B filters are arranged in the vertical direction, across the G filter at the center. Meanwhile, in the B array, the B filters are arranged in the horizontal direction, and the R filters are arranged in the vertical direction, across the G filter at the center. Therefore, although the positional relationship between the R and B filters is opposite in the A and B arrays, the rest of the arrangement is the same.

Figure 8:
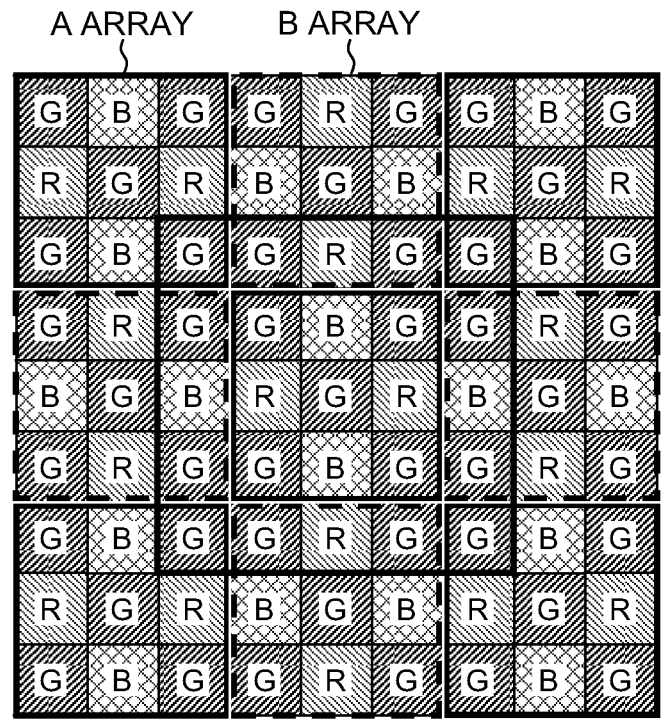
FIG. 8 is a diagram showing a color filter array in which the basic array pattern of 6×6 pixels included in the color filter array of the color imaging element of the second embodiment are divided into A arrays and B arrays of 3×3 pixels, and the A arrays and the B arrays are repeatedly arranged in horizontal and vertical directions.

The A and B arrays are alternately arranged in the horizontal and vertical directions as shown in FIG. 8, and the G filters at four corners of the A and B arrays form G filters of square arrays corresponding to 2×2 pixels.

The G filters as luminance pixels are arranged at the four corners and the center in 3×3 pixels in the A or B array, and the 3×3 pixels are alternately arranged in the horizontal and vertical directions to form the G filters in the square arrays corresponding to 2×2 pixels. The arrays satisfy the features (1), (3), and (5), and the feature (2) is satisfied for the G filters.

More specifically, the color filter array (basic array pattern P) shown in FIG. 6 includes square arrays corresponding to 2×2 pixels of G filters.

Figure 9:
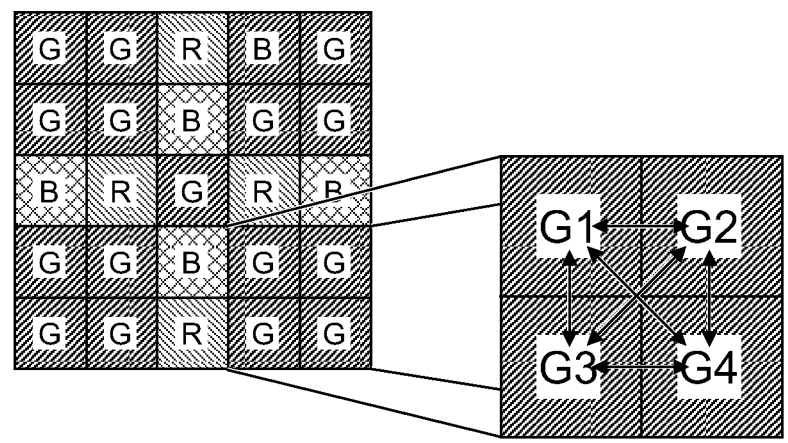
FIG. 9 is a diagram showing a characteristic arrangement of G pixels in the color filter array of the color imaging element of the second embodiment.
Figure 14:
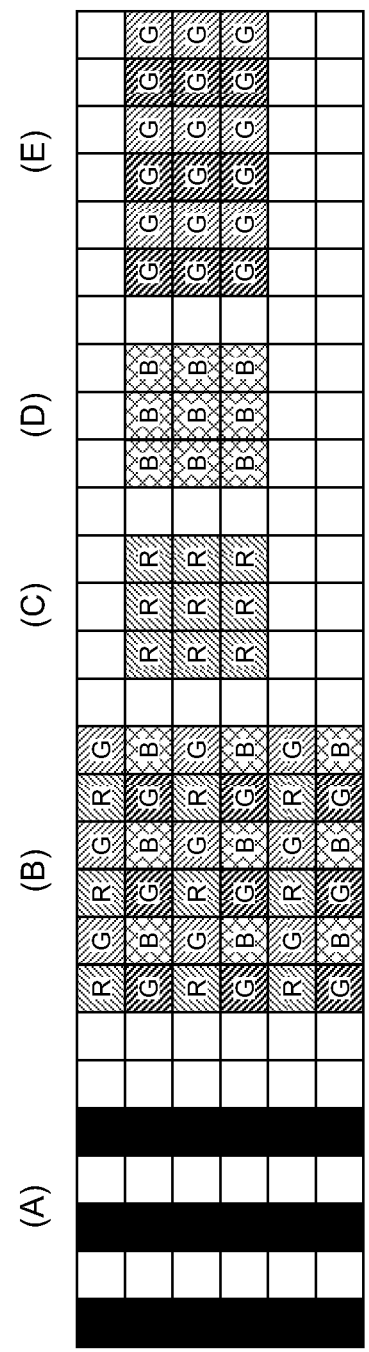
FIG. 14 is a diagram used to explain a problem of a conventional color imaging element with color filters in a Bayer array.
Figure 15:
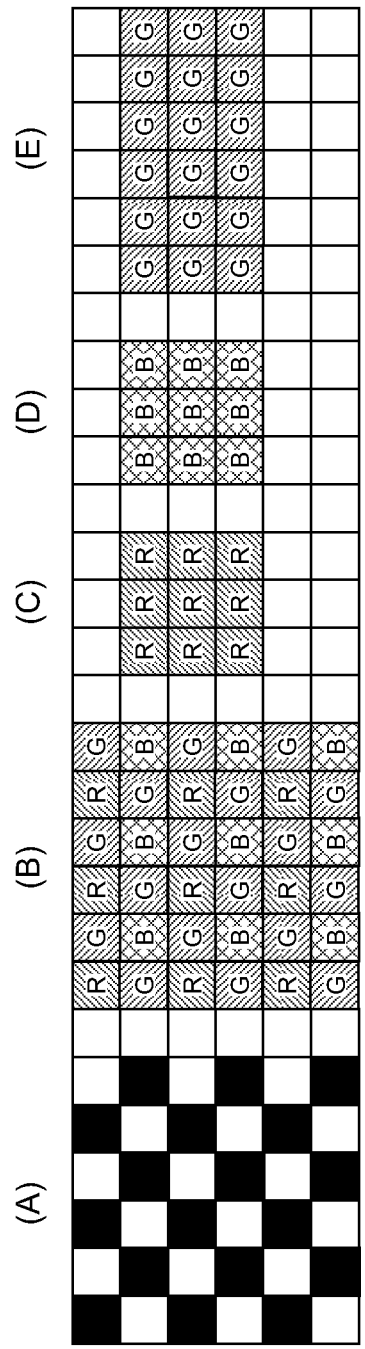
FIG. 15 is another diagram used to explain a problem of a conventional color imaging element with color filters in a Bayer array.

When a local area (area indicated by a thick frame) of 5×5 pixels is extracted around the A array from the mosaic image output from the color imaging element of the second embodiment as shown in FIG. 8, 2×2 G pixels at four corners in the local area are arranged as shown in FIG. 9.

When the pixel values of 2×2 G pixels are defined as G1, G2, G3, and G4 from the upper left to the lower right as shown in FIG. 9, the difference absolute value in the vertical direction of the pixel values of G pixels is (|G1−G3|+|G2−G4|)/2, the difference absolute value in the horizontal direction is (|G1−G2|+|G3−G4|)/2, the difference absolute value in the upper right oblique direction is |G2−G3|, and the difference absolute value in the upper left oblique direction is |G1−G4|.

It can be determined that there is a correlation (correlation direction) in the direction with the minimum difference absolute value among the four correlation absolute values.

When the local area of 5×5 pixels is extracted from the mosaic image so that the A array of 3×3 pixels is positioned at the center as shown in FIG. 8 or 9, 2×2 G pixels are arranged at four corners. Therefore, when 3×3 pixels of the A array in the local area are the target pixels of the demosaicing processing, sums (or average values) of the correlation absolute values in each direction at four corners are calculated, and the direction with the minimum value among the sums (or the average values) of the correlation absolute values in each direction is determined as the correlation direction of luminance in the target pixels of the demosaicing processing.

The basic array pattern P that forms the color filter array shown in FIG. 6 is point symmetric with respect to the center (the center of four G filters) of the basic array pattern. As shown in FIG. 7, the A and B arrays in the basic array pattern are point symmetric with respect to the G filter the center, and the A and B arrays are also vertically and horizontally symmetric (line symmetric).

In the basic array pattern of the color filter array shown in FIG. 6, the numbers of pixels of the R pixels, the G pixels, and the B pixels corresponding to the R, G, and B filters in the basic array pattern are eight pixels, twenty pixels, and eight pixels, respectively. Therefore, the ratio of the numbers of pixels of the RGB pixels is 2:5:2, and the proportion of the number of G pixels that most contribute to obtaining the luminance signals is greater than the proportions of the numbers of R or B pixels of other colors.

In this way, the color filter array of the color imaging element of the second embodiment has the same features as the features (1), (2), (3), (4), and (5) of the color filter array of the color imaging element of the first embodiment.

The color filter array of the color imaging element of the second embodiment includes the G filters arranged in each line in the oblique (NE, NW) directions of the color filter array. The color filter array has a feature of further improving the reproduction accuracy of the demosaicing processing in the high-frequency area, the feature not included in the color filter array of the color imaging element of the first embodiment.

{Third Embodiment of Color Imaging Element}

Figures 10, 11:
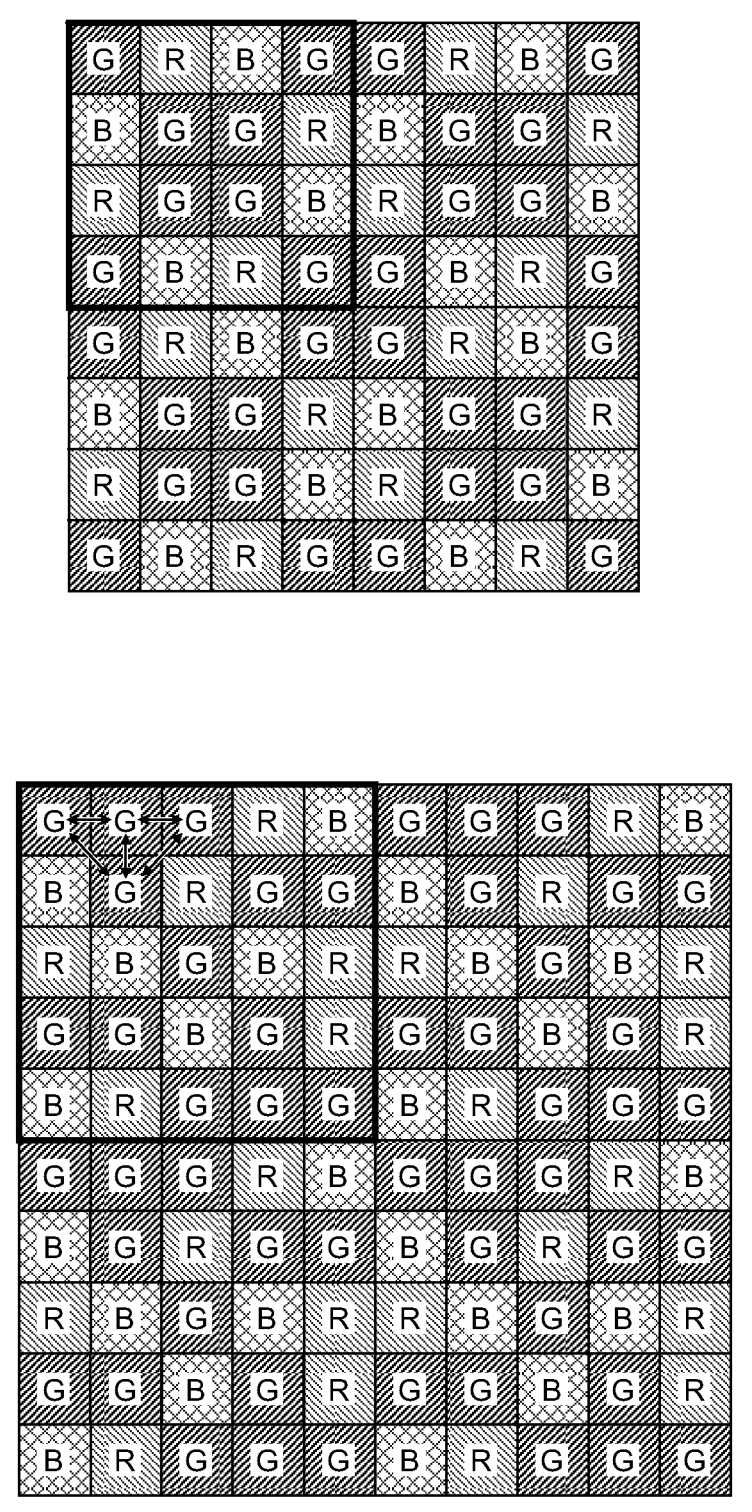

FIG. 10 is a diagram showing a third embodiment of the color imaging element applied to the present invention. FIG. 10 particularly shows a color filter array of the color filters arranged on the color imaging element.

As shown in FIG. 10, the color filter array of the color imaging element includes a basic array pattern (pattern indicated by a thick frame) formed by a square array pattern corresponding to 4×4 pixels, and the basic array pattern is repeatedly arranged in the horizontal and vertical directions. Therefore, the color filter array includes filters of each of R, G, and B colors (R filters, G filters, and B filters) arranged in a predetermined cycle.

The color filter array shown in FIG. 10 includes one or more filters of all R, G, and B colors in each line in the horizontal and vertical directions of the basic array pattern.

The G filers corresponding to the luminance pixels are arranged to include sections where two or more G filters are adjacent to each other in the horizontal, vertical, and oblique (NE, NW) directions of the basic array pattern. The pixel values of the G pixels corresponding to the adjacent G filters allow determining the correlations of luminance in the horizontal, vertical, and oblique (NE, NW) directions at minimum pixel intervals.

The basic array pattern forming the color filter array is point symmetric with respect to the center of the basic array pattern.

In the basic array pattern of the color filter array shown in FIG. 10, the numbers of pixels of the R pixels, the G pixels, and the B pixels corresponding to the R, G, and B filters in the basic array pattern are four pixels, eight pixels, and four pixels, respectively. Therefore, the ratio of the numbers of pixels of the RGB pixels is 1:2:1, and the proportion of the number of G pixels that most contribute to obtaining the luminance signals is greater than the proportions of the numbers of R or B pixels of other colors.

The color filter array of the color imaging element of the third embodiment has the same features as the features (1), (2), (3), (4), and (5) of the color filter array of the color imaging element 12 of the first embodiment.

{Fourth Embodiment of Color Imaging Element}

FIG. 11 is a diagram showing a fourth embodiment of the color imaging element applied to the present invention. FIG. 11 particularly shows a color filter array of the color filters arranged on the color imaging element.

As shown in FIG. 11, the color filter array of the color imaging element includes a basic array pattern (pattern indicated by a thick frame) formed by a square array pattern corresponding to 5×5 pixels, and the basic array pattern is repeatedly arranged in the horizontal and vertical directions. Therefore, the color filter array includes filters of each of R, G, and B colors (R filters, G filters, and B filters) arranged in a predetermined cycle.

The color filter array shown in FIG. 11 includes one or more filters of all R, G, and B colors in each line in the horizontal and vertical directions of the basic array pattern.

The G filers corresponding to the luminance pixels are arranged to include sections where two or more G filters are adjacent to each other in the horizontal, vertical, and oblique (NE, NW) directions of the basic array pattern. The pixel values of the G pixels corresponding to the adjacent G filters allow determining the correlations of luminance in the horizontal, vertical, and oblique (NE, NW) directions at minimum pixel intervals.

In the basic array pattern of the color filter array shown in FIG. 11, the numbers of pixels of the R pixels, the G pixels, and the B pixels corresponding to the R, G, and B filters in the basic array pattern are six pixels, thirteen pixels, and six pixels, respectively. Therefore, the ratio of the numbers of pixels of the RGB pixels is 6:13:6, and the proportion of the number of G pixels that most contribute to obtaining the luminance signals is greater than the proportions of the numbers of R or B pixels of other colors.

The color filter array of the color imaging element of the third embodiment has the same features as the features (1), (2), (3), and (5) of the color filter array of the color imaging element 12 of the first embodiment.

{Fifth Embodiment of Color Imaging Element}

Figure 12:
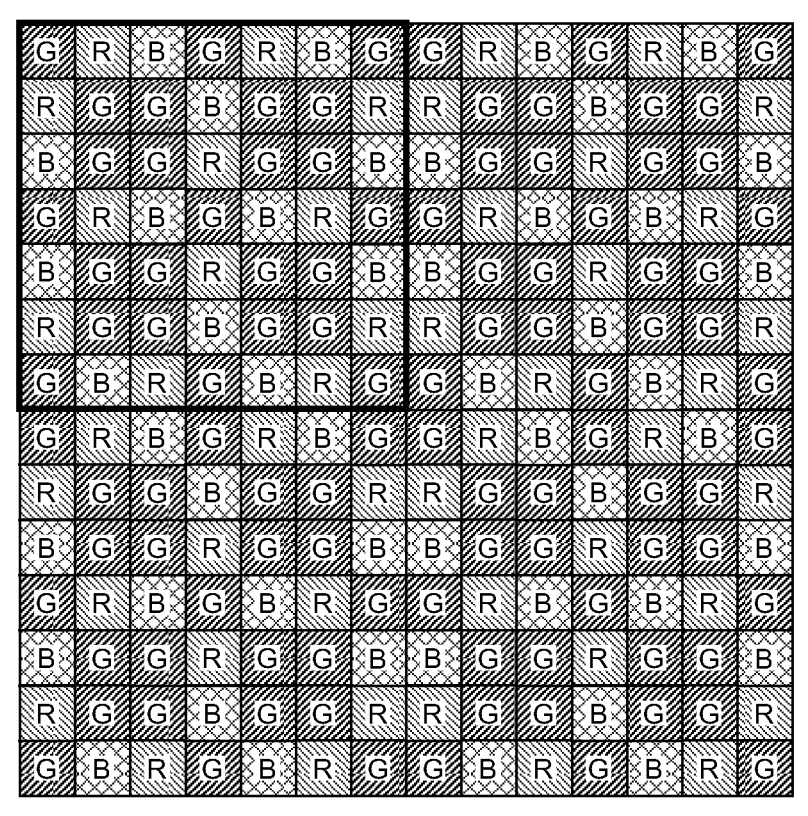

FIG. 12 is a diagram showing a fifth embodiment of the color imaging element applied to the present invention. FIG. 12 particularly shows a color filter array of the color filters arranged on the color imaging element.

As shown in FIG. 12, the color filter array of the color imaging element includes a basic array pattern (pattern indicated by a thick frame) formed by a square array pattern corresponding to 7×7 pixels, and the basic array pattern is repeatedly arranged in the horizontal and vertical directions. Therefore, the color filter array includes filters of each of R, G, and B colors (R filters, G filters, and B filters) arranged in a predetermined cycle.

The color filter array shown in FIG. 12 includes filters of all R, G, and B colors arranged in each line in the horizontal and vertical directions of the basic array pattern.

The G filers corresponding to the luminance pixels are arranged to include sections where two or more G filters are adjacent to each other in the horizontal, vertical, and oblique (NE, NW) directions of the basic array pattern. More specifically, there are four sets of G pixels including vertically and horizontally adjacent 2×2 pixels in the basic array pattern. The pixel values of the G pixels corresponding to the adjacent G filters allow determining the correlations of luminance in the horizontal, vertical, and oblique (NE, NW) directions at minimum pixel intervals.

The basic array pattern forming the color filter array is point symmetric with respect to the center of the basic array pattern.

In the basic array pattern of the color filter array shown in FIG. 12, the numbers of pixels of the R pixels, the G pixels, and the B pixels corresponding to the R, G, and B filters in the basic array pattern are twelve pixels, twenty five pixels, and twelve pixels, respectively. Therefore, the ratio of the numbers of pixels of the RGB pixels is 12:25:12, and the proportion of the number of G pixels that most contribute to obtaining the luminance signals is greater than the proportions of the numbers of R or B pixels of other colors.

The color filter array of the color imaging element of the fourth embodiment has the same features as the features (1), (2), (3), (4), and (5) of the color filter array of the color imaging element 12 of the first embodiment.

{Sixth Embodiment of Color Imaging Element}

Figure 13:
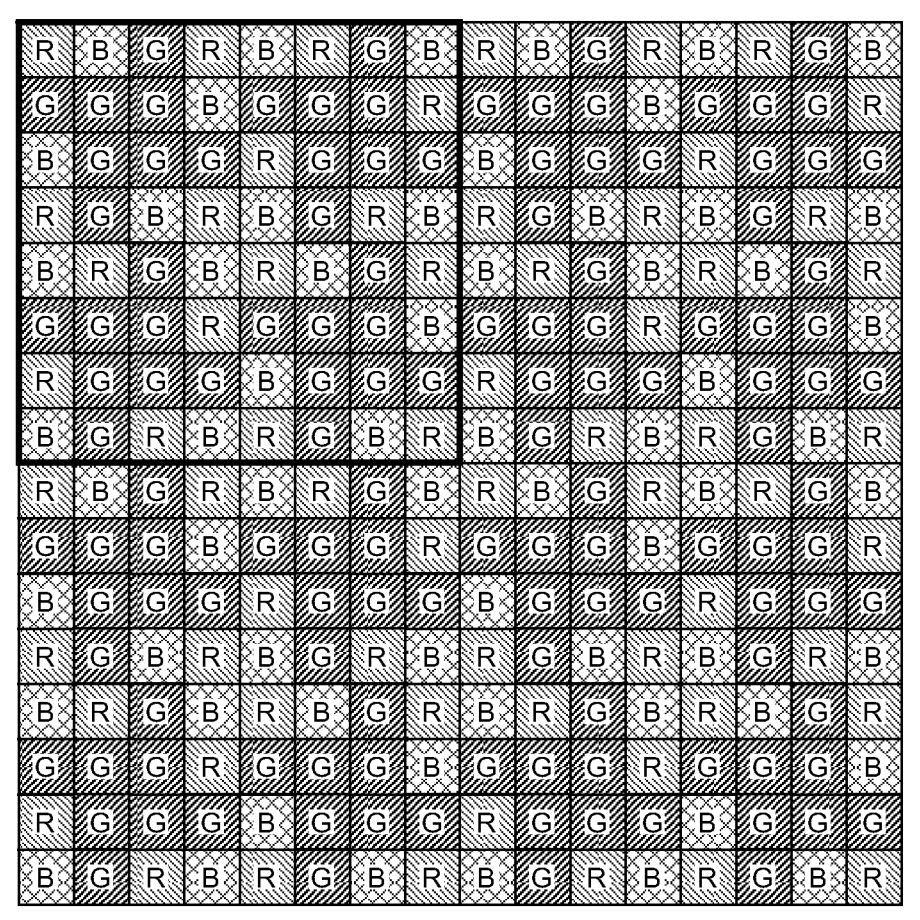

FIG. 13 is a diagram showing a sixth embodiment of the color imaging element applied to the present invention. FIG. 13 particularly shows a color filter array of the color filters arranged on the color imaging element.

As shown in FIG. 13, the color filter array of the color imaging element includes a basic array pattern (pattern indicated by a thick frame) formed by a square array pattern corresponding to 8×8 pixels, and the basic array pattern is repeatedly arranged in the horizontal and vertical directions. Therefore, the color filter array includes filters of each of R, G, and B colors (R filters, G filters, and B filters) arranged in a predetermined cycle.

The color filter array shown in FIG. 13 includes filters of all R, G, and B colors arranged in each line in the horizontal and vertical directions of the basic array pattern.

The G filers corresponding to the luminance pixels are arranged to include sections where two or more G filters are adjacent to each other in the horizontal, vertical, and oblique (NE, NW) directions of the basic array pattern. More specifically, there are four sets of G pixels including vertically and horizontally adjacent 2×2 pixels in the basic array pattern. The pixel values of the G pixels corresponding to the adjacent G filters allow determining the correlations of luminance in the horizontal, vertical, and oblique (NE, NW) directions at minimum pixel intervals.

The basic array pattern forming the color filter array is point symmetric with respect to the center of the basic array pattern.

In the basic array pattern of the color filter array shown in FIG. 13, the numbers of pixels of the R pixels, the G pixels, and the B pixels corresponding to the R, G, and B filters in the basic array pattern are sixteen pixels, thirty two pixels, and sixteen pixels, respectively. Therefore, the ratio of the numbers of pixels of the RGB pixels is 1:2:1, and the proportion of the number of G pixels that most contribute to obtaining the luminance signals is greater than the proportions of the numbers of R or B pixels of other colors.

The color filter array of the color imaging element of the sixth embodiment has the same features as the features (1), (2), (3), (4), and (5) of the color filter array of the color imaging element 12 of the first embodiment.

{Others}

Although the color imaging element with color filters of three primary colors of RGB has been described in the embodiments, the present invention is not limited to this. The present invention can also be applied to a color imaging element with color filters of four colors including three primary colors of RGB and another color (for example, emerald (E)).

The present invention can also be applied to a color imaging element with color filters of four complementary colors including G in addition to C (cyan), M (magenta), and Y (yellow) that are complementary colors of the primary colors RGB.

In the color filter arrays of the color imaging element of the first to sixth embodiments, the proportion of the number of G pixels that most contribute to obtaining the luminance signals is greater than the proportions of the numbers of R or B pixels. However, if the proportion of the number of G pixels is too large, the proportions of the numbers of R or B pixels are reduced, and false color easily occurs at a high frequency section. Therefore, it is preferable that the number of G pixels is 1.5 to 3 times the numbers of each of the R and B pixels.

The present invention is not limited to the embodiments, and it is obvious that various changes can be made without departing from the scope of the present invention.

The invention claimed is:

1. A single-plate color imaging element including color filters in a predetermined color filter array arranged on a plurality of pixels formed by photoelectric conversion elements arranged in horizontal and vertical directions, wherein
the color filter array includes a predetermined basic array pattern including first filters corresponding to a first color that most contributes to obtaining luminance signals and second filters corresponding to two or more second colors other than the first color, the basic array pattern repeatedly arranged in the horizontal and vertical directions,
one or more of the first filters and one or more of each of the second filters respectively corresponding to the two or more second colors are arranged in each line in the horizontal and vertical directions of the color filter array in the basic array pattern, and
in the color filter array, the first filters are vertically and horizontally arranged across a filter at a center of a 3×3 pixel group in the 3×3 pixel group, wherein a second filter is arranged at the center of the 3×3 pixel group, the basic array pattern includes a plurality of 3×3 pixel groups and the first filters are arranged in a same pattern in each of the 3×3 pixel groups in the basic array pattern, and wherein the 3×3 pixel groups are arranged in the basic array pattern with no space between the 3×3 pixel groups.

2. The color imaging element according to claim 1, wherein
the color filter array in the predetermined basic array pattern is point symmetric with respect to a center of the basic array pattern.

3. The color imaging element according to claim 1, wherein
the predetermined basic array pattern is a square array pattern corresponding to 6×6pixels.

4. The color imaging element according to claim 2, wherein
the predetermined basic array pattern is a square array pattern corresponding to 6×6pixels.

5. The color imaging element according to claim 1, wherein
the second colors include a second color and a third color, wherein
the color filters include the first filters, second filters, and third filters respectively corresponding to the first, the second, and the third colors, and
the basic array pattern includes: a first array corresponding to 3×3 pixels, the first array including the second filter arranged at a center, the third filters arranged at four corners, and the first filters vertically and horizontally arranged across the second filter at the center; and a second array corresponding to 3×3 pixels, the second array including the third filter arranged at a center, the second filters arranged at four corners, and the first filters vertically and horizontally arranged across the third filter at the center, wherein the first and second arrays are alternately arranged in the horizontal and vertical directions.

6. A single-plate color imaging element including color filters in a predetermined color filter array arranged on a plurality of pixels formed by photoelectric conversion elements arranged in a horizontal direction and a vertical direction, wherein
the color filter array includes a predetermined basic array pattern including first filters corresponding to a first color that most contributes to obtaining luminance signals and second filters corresponding to two or more second colors other than the first color, the basic array pattern repeatedly arranged in the horizontal direction and the vertical direction,
one or more of the first filters and one or more of each of the second filters respectively corresponding to the two or more second colors are arranged in each line in the horizontal direction and the vertical direction of the color filter array within the basic array pattern, and
within the basic array pattern in the color filter array, two pairs of filters, in each of which two first filters are adjacent to each other in the horizontal direction, are arranged in the horizontal direction across one filter of one of the second colors, and two pairs of filters, in each of which two first filters are adjacent to each other in the vertical direction, are arranged in the vertical direction across the one filter of one of the second colors.

7. The color imaging element according to claim 6, wherein
the predetermined basic array pattern is a square array pattern corresponding to 6×6pixels.

8. The color imaging element according to claim 5, wherein the first color is green (G), and the second color is red (R), and the third color is blue (B), and the first filters are G filters, the second filters are R filters, and the third filters are B filters.

* * * * *